United States Patent
Chowdhury et al.

(10) Patent No.: US 10,797,632 B2
(45) Date of Patent: Oct. 6, 2020

(54) SENSITIVE DIRECTIONAL ELEMENT FOR GENERATOR PROTECTION

(71) Applicant: Schweitzer Engineering Laboratories, Inc., Pullman, WA (US)

(72) Inventors: Ritwik Chowdhury, Toronto (CA); Dale S. Finney, Little Bras D'or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 23 days.

(21) Appl. No.: 16/275,696

(22) Filed: Feb. 14, 2019

(65) Prior Publication Data
US 2020/0067445 A1 Feb. 27, 2020

Related U.S. Application Data

(60) Provisional application No. 62/720,372, filed on Aug. 21, 2018.

(51) Int. Cl.
*G01R 31/14* (2006.01)
*H02P 29/024* (2016.01)
*G01R 31/34* (2020.01)
*G01R 31/50* (2020.01)

(52) U.S. Cl.
CPC ........ *H02P 29/0241* (2016.02); *G01R 31/343* (2013.01); *G01R 31/50* (2020.01)

(58) Field of Classification Search
CPC ........ G01R 31/50; G01R 31/51; G01R 31/52; G01R 31/343; G01R 31/025; G01R 31/086; G01R 31/088
See application file for complete search history.

(56) References Cited

U.S. PATENT DOCUMENTS

| | | |
|---|---|---|
| 2,881,319 A | 4/1959 | Sills |
| 3,727,123 A | 4/1973 | Smith |
| 3,973,171 A | 8/1976 | Howell |
| 4,000,464 A | 12/1976 | Nussel |
| 4,001,646 A | 1/1977 | Howell |
| 4,029,951 A | 6/1977 | Berry |

(Continued)

FOREIGN PATENT DOCUMENTS

| | | |
|---|---|---|
| CN | 203324449 U | 12/2013 |
| JP | 53107640 | 9/1978 |

(Continued)

OTHER PUBLICATIONS

Rik Pintelon, Johan Schoukens, System Identification: A Frequency Domain Approach, Section 4.3 (pp. 119-131), Jan. 1, 2001.

(Continued)

*Primary Examiner* — Thang X Le
(74) *Attorney, Agent, or Firm* — Richard M. Edge

(57) ABSTRACT

Disclosed are systems and methods to determine a direction to a fault of an electrical generator using sensitive current. A ground fault is determined using voltage signals from the generator installation. Incremental residual values of the sensitive current, along with the voltage, are used to determine a direction to the fault. The generator may be high-impedance grounded. The systems and methods further indicate the direction to a fault where multiple generators are connected using a common generation bus.

20 Claims, 12 Drawing Sheets

(56) References Cited

U.S. PATENT DOCUMENTS

| | | |
|---|---|---|
| 4,066,950 A | 1/1978 | Rumold |
| 4,088,935 A | 5/1978 | D'Atre |
| 4,148,087 A | 4/1979 | Phadke |
| 4,156,186 A | 5/1979 | Wolfinger |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 4,982,147 A | 1/1991 | Lauw |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,365,396 A | 11/1994 | Roberts |
| 5,471,880 A | 12/1995 | Lang |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,963,404 A | 10/1999 | Guzman-Casillas |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,496,757 B1 | 12/2002 | Flueck |
| 6,525,504 B1 | 2/2003 | Nygren |
| 6,573,726 B1 | 6/2003 | Roberts |
| 6,714,020 B2 | 3/2004 | Hobelsberger |
| 6,718,271 B1* | 4/2004 | Tobin ............... G01R 31/50 |
| | | 702/58 |
| 6,721,671 B2 | 4/2004 | Roberts |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1 | 8/2007 | Kasztenny |
| 7,304,403 B2 | 12/2007 | Xu |
| 7,498,818 B2 | 3/2009 | Benmouyal |
| 7,528,611 B2 | 5/2009 | Kasztenny |
| 7,532,010 B2 | 5/2009 | Kamel |
| 7,592,772 B2 | 9/2009 | Nandi |
| 7,693,607 B2 | 4/2010 | Kasztenny |
| 7,710,693 B2 | 5/2010 | Guzman-Casillas |
| 7,804,303 B2 | 9/2010 | Benmouyal |
| 8,405,940 B2 | 3/2013 | Schweitzer, III |
| 8,942,954 B2* | 1/2015 | Gong ............... G01R 31/085 |
| | | 702/185 |
| 9,496,707 B2 | 11/2016 | Thompson |
| 2001/0001534 A1 | 5/2001 | Lawson |
| 2002/0128759 A1 | 9/2002 | Sodoski |
| 2002/0140433 A1 | 10/2002 | Lawson |
| 2003/0085715 A1 | 5/2003 | Lubkeman |
| 2005/0033481 A1 | 2/2005 | Budhraja |
| 2006/0125486 A1 | 6/2006 | Premerlani |
| 2007/0085549 A1 | 4/2007 | Fischer |
| 2008/0074810 A1 | 3/2008 | Guzman-Casillas |
| 2009/0039655 A1 | 2/2009 | Berchowitz |
| 2009/0160454 A1 | 6/2009 | Johansson |
| 2009/0219030 A1 | 9/2009 | Salem |
| 2009/0254297 A1 | 10/2009 | Bengtsson |
| 2010/0194324 A1 | 8/2010 | Kasztenny |
| 2011/0085272 A1 | 4/2011 | Schweitzer |
| 2011/0158786 A1 | 6/2011 | Molitor |
| 2012/0112758 A1 | 5/2012 | Weems |
| 2012/0123708 A1* | 5/2012 | Dong ............... H02H 3/42 |
| | | 702/58 |
| 2013/0300209 A1 | 11/2013 | Long |
| 2015/0051852 A1 | 2/2015 | Pan |
| 2015/0222122 A1 | 8/2015 | Nuqui |
| 2016/0025811 A1* | 1/2016 | Kasztenny ......... G01R 31/343 |
| | | 324/765.01 |
| 2016/0049891 A1 | 2/2016 | Frampton |
| 2016/0181790 A1 | 6/2016 | Thompson |
| 2018/0210060 A1* | 7/2018 | Guzman-Casillas ..... |
| | | G01R 35/00 |
| 2019/0072603 A1* | 3/2019 | Liu ............... G01R 31/085 |

FOREIGN PATENT DOCUMENTS

| | | |
|---|---|---|
| JP | 56002569 | 1/1981 |
| JP | 03212117 | 9/1991 |
| JP | 07177646 | 7/1995 |
| JP | 11133093 | 5/1999 |
| JP | 2000333359 | 11/2000 |
| WO | WO0239642 | 5/2002 |
| WO | WO2014067742 | 5/2014 |

OTHER PUBLICATIONS

Beckwith Electric Co., Inc., M-3425A Generator Protection flyer, 2001.

Beckwith Electric Co., Inc., M-3425A Generator Protection Instruction Book, 2004.

Siemens AG, Numerical Machine Protection Manual 7UM515 V3.1, Published 1996.

ABB, Type DGF Generator Field Relay Instruction Leaflet, ABB Inc. Feb. 1977.

J.Lewis Blackburn, Protective Relaying Principles and Applications, Chapter 8: Generator Protection, pp. 262-267, 1997.

Tyco Electronics Energy Division, Installation and Operating Instructions R.O.C.O.F. Protection Relay, Issue 1, Nov. 2002.

Siemens, Siprotec 5 Generator Protection 7UM85 Manual, Sections 6.7-6.9, Nov. 2015.

Dale Finney and Gerald Johnson, Loss of Prime Mover (Antimotoring) Protection, IEEE Tutorial on the Protection of Synchronous Generators, Special Publication of the IEEE Power System Relaying Committee, Second Ed., Chapter 3, Section 5, 2011.

IEEE, IEEE Guide for AC Generator Protection, IEEE STD C37. 102-1006, pp. 68-70, 2007.

Michael Simpson and John Merrell, Low Zero-Sequence Impedances on Generators, Aug. 30, 2000.

Mu Longhua and Li Xiaobo, Selective Ground-fault Protection Using an Adaptive Algorithm Model in Neutral Ungrounded Power Systems, IEEE International Conference on Power System Technology, Dec. 2000.

Beckwith Electric Co., Inc., Application Note #27, "Beckwith Electric M-3425A Generator Protection Relay Setting Clarification 27TN Third Harmonic Undervoltage Element", Dec. 13, 2004.

Benmouyal, G. "The Impact of Synchronous Generators Excitation Supply on Protection Relays". Schweitzer Engineering Laboratories, Inc. Oct. 29, 2007.

(56) References Cited

OTHER PUBLICATIONS

Klingerman, Nathan, Et al., "Understanding Generator Stator Ground Faults and Their Protection Schemes", Presented at the 42nd Annual Western Protective Relay Conference, Oct. 2015.
Schweitzer Engineering Laboratories, Inc., SEL-300G Generator Relay flyer, Jun. 22, 2007.

* cited by examiner

SENSITIVE DIRECTIONAL ELEMENT FOR GENERATOR PROTECTION

RELATED APPLICATIONS

This application claims priority under 35 U.S.C. § 119 to U.S. Provisional Patent Application No. 62/720,372 filed on Aug. 21, 2018, titled "Sensitive Directional Element for Generator Protection," which is hereby incorporated by reference in its entirety.

TECHNICAL FIELD

This disclosure relates to systems and methods for detecting a direction of a fault in a generator of an electric power delivery system. This disclosure further relates to determining whether a ground fault is internal or external to an electric generator. This disclosure further relates to using incremental residual current measurements to determine a direction to a ground fault in a high-impedance grounded generator of an electric power delivery system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
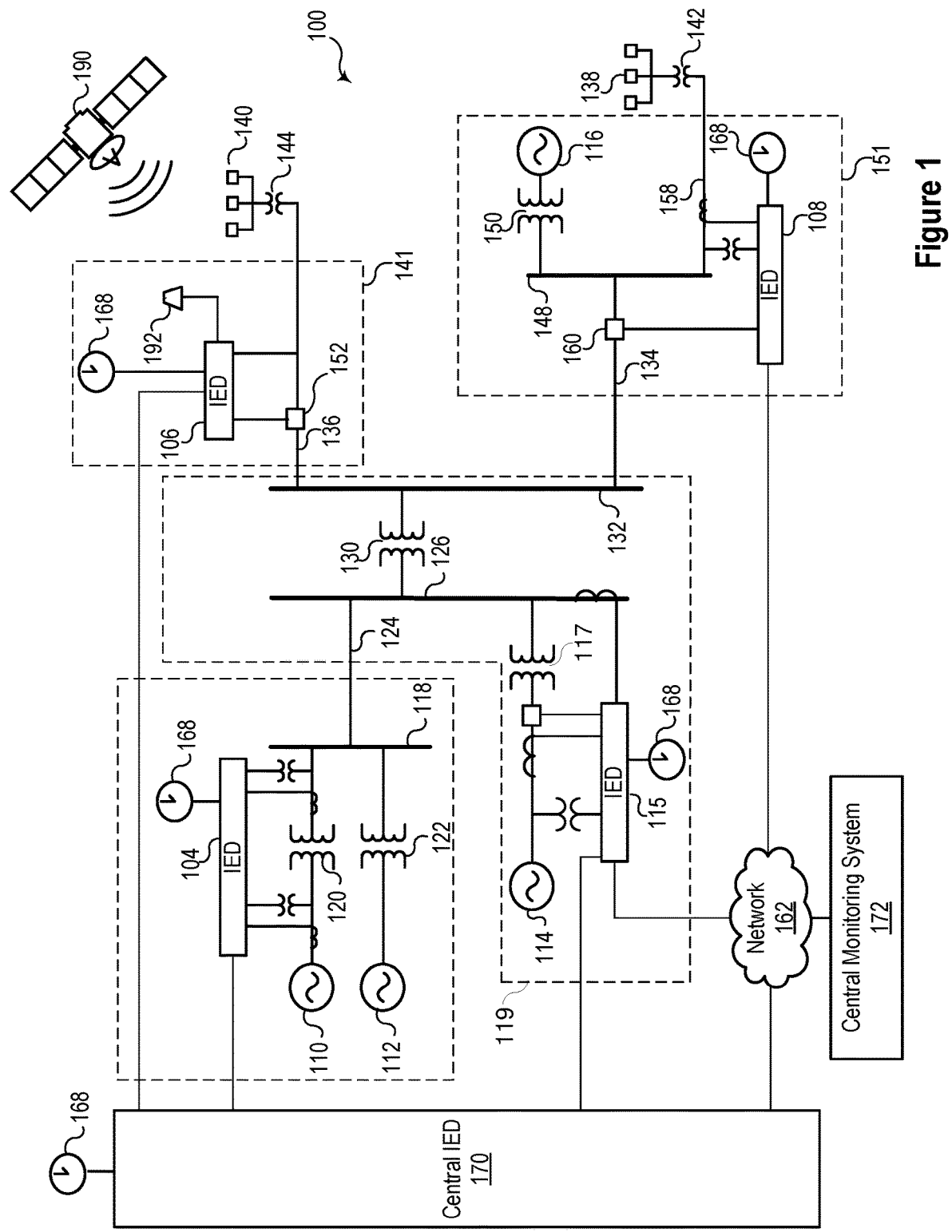
FIG. 1 illustrates a simplified one-line diagram of an electric power delivery system consistent with embodiments of the present disclosure.

Electric power delivery systems include varied equipment used to maintain the reliability of electric power generation, transmission, and distribution. Generators play the important role of generating the electric power that is transmitted, distributed, and consumed using the electric power delivery system. Generators may be embodied in many different forms, and may be in electrical connection with the electric power delivery system in different ways, and may even be grounded in different ways. Many generators include a prime mover which rotates a rotor near a stator such that a voltage is induced in the windings of the stator by the rotation of the rotor. Generators may be multi-phase, with many generators in modern electric power delivery systems providing three phases of power.

Generators may be connected to ground in various ways. In certain implementations, generators are connected to ground by high-impedance through a neutral point. A neutral grounding resistor across the neutral grounding transformer may then be used to obtain electrical signals used in protection of the generator. However, proper protection of high-impedance grounding of a generator requires that ground faults in the generator be detected so that the generator may be disconnected to protect it from further damage due to the ground fault.

Previous attempts to selectively detect ground faults in a high-impedance grounded generator have not been sufficiently dependable. For example, in one solution, a current signal obtained using current transformers (CTs) in connection with the generator. However, the solution using only currents resulted in diminished sensitivity in certain applications. Hence, such solutions lack dependability. What is needed is a system for providing sensitive ground fault direction in a generator with high-impedance grounding. Disclosed herein are improvements to existing ground fault detection technology. The specific improvements include calculating a ground fault direction using incremental zero-sequence current measurements.

Systems and methods consistent with the present disclosure may monitor the electrical parameters associated with electric power system generators with high-impedance grounding, to detect a direction of a ground fault in the generator. In certain embodiments, ground fault direction is calculated using incremental zero-sequence current for improved sensitivity of ground fault direction determination in the high-impedance generator. This improves the functioning of the generator and the functioning of a device configured to monitor the generator by providing an indication as to whether the ground fault is internal to the protected generator or external thereto. Knowledge of the fault being external would save significant cost as it removes the need to test the stator winding. Furthermore, the embodiments herein improve the functioning of the generator and the functioning of a device configured to monitor the generator in that when multiple high-impedance grounded generators share a common bus, it allows selective unit tripping.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static volt ampere reactive (VAR) compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

FIG. 1 illustrates a simplified one-line diagram of an electric power transmission and distribution system 100 configured to utilize one or more secondary time sources to verify the accuracy of a primary time source consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138), and the like. A variety of other types of equipment may also be included in electric power delivery system 100, such as voltage regulators, capacitor banks, and the like.

Substation 119 may include a generator 114, which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further, step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using IEDs, such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IED 104 may be configured to monitor parameters associated with generator 110 and/or transformer 120. Such parameters may include monitoring currents, voltages, frequencies, and/or other electrical conditions of generator 110. IED 104 may be configured to monitor physical parameters associated with generator 110, such as rotational speed, angular position, etc. Such parameters may also be used to calculate a torque caused by connection of generator 110 to the rest of the system 100. Still further, electrical parameters may be monitored to determine presence of an overexcitation condition on the generator 110 in accordance with several embodiments herein.

IED 104 may further be configured to monitor the electrical parameters of transformer 120. Such parameters may include currents, voltages, and/or other electrical conditions of transformer 120. The electrical parameters may be analyzed to determine presence of overexcitation conditions on the transformer 120 in accordance with several embodiments herein.

Network 162 may be used to transmit information among various components in system 100, including IEDs 108, 115, 170, and central monitoring system 172. Information relating to electrical and mechanical parameters associated with rotating machinery in system 100 may be transmitted using network 162. One or more of IEDs, 104, 106, 108, 115, and 170 may be configured to implement the systems and methods contained herein for one or more pieces of rotating machinery in system 100.

A common time signal 168 may be used to time-align measurements for comparison and/or to synchronize action across system 100. Utilizing a common or universal time source may ensure that IEDs have a synchronized time signal that can be used to generate time-synchronized data, such as synchrophasors. In various embodiments, the common time source may comprise a time signal from a global navigation satellite system ("GNSS") system 190. IED 106 may include a receiver 192 configured to receive the time signal from the GNSS system 190. In various embodiments, IED 106 may be configured to distribute the time signal to other components in system 100, such as IEDs 104, 108, 115, and 170.

Figure 2:
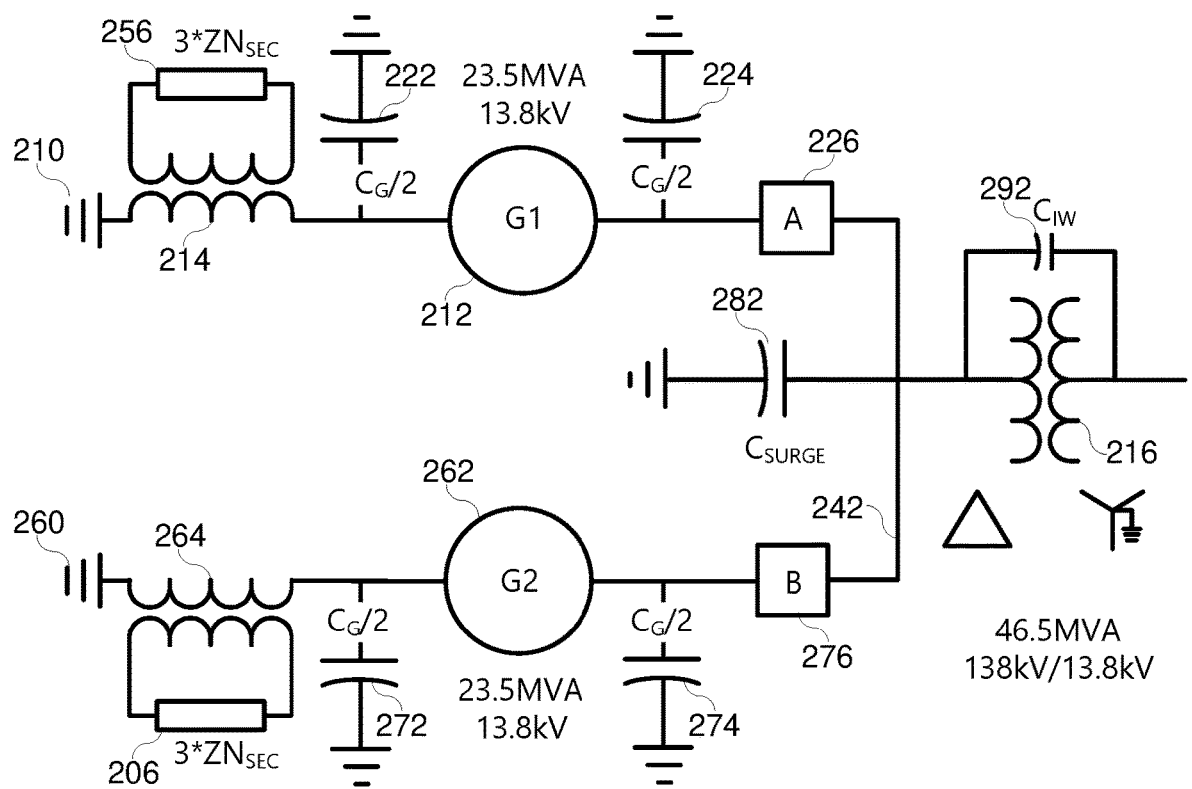
FIG. 2 illustrates a simplified one-line diagram of an electric power delivery system with high-impedance grounded generators that may be protected using the embodiments described herein.

FIG. 2 illustrates a simplified one-line diagram of an electric power generation system including multiple generator units in connection with a common bus, that may benefit from the selective directional ground fault detection embodiments described herein. The system includes two generators 212 and 262 in connection with a common generation bus 242 for providing electric power to the electric power delivery system via transformer 216. Generator 212 is high-impedance grounded to ground 210 using a high-impedance grounding transformer 214 that includes a grounding resistor 256. The insulation capacitance of the stator winding of generator 212 is represented by capacitors 222 and 224. Generator 212 is in connection with the generation bus 242 via circuit breaker 226. Similarly, generator 262 is high-impedance grounded to ground 260 using a high-impedance grounding transformer 264 that includes a grounding resistor 206. The insulation capacitance of the stator winding of generator 262 is represented by capacitors 272 and 274. Generator 262 is in connection with the generation bus 242 via circuit breaker 276. Capacitance between generation bus 242 and ground is represented by capacitor 282. Capacitance across the transformer 216 is represented by capacitor 292. As has been suggested above, embodiments herein may be used to determine a ground fault in the generators 212, 262 that provide electric power to a common generation bus 242, and are high-impedance grounded. Indeed, the embodiments herein may be used to selectively determine which generator 212 or 262 have the ground fault.

Figure 3A:
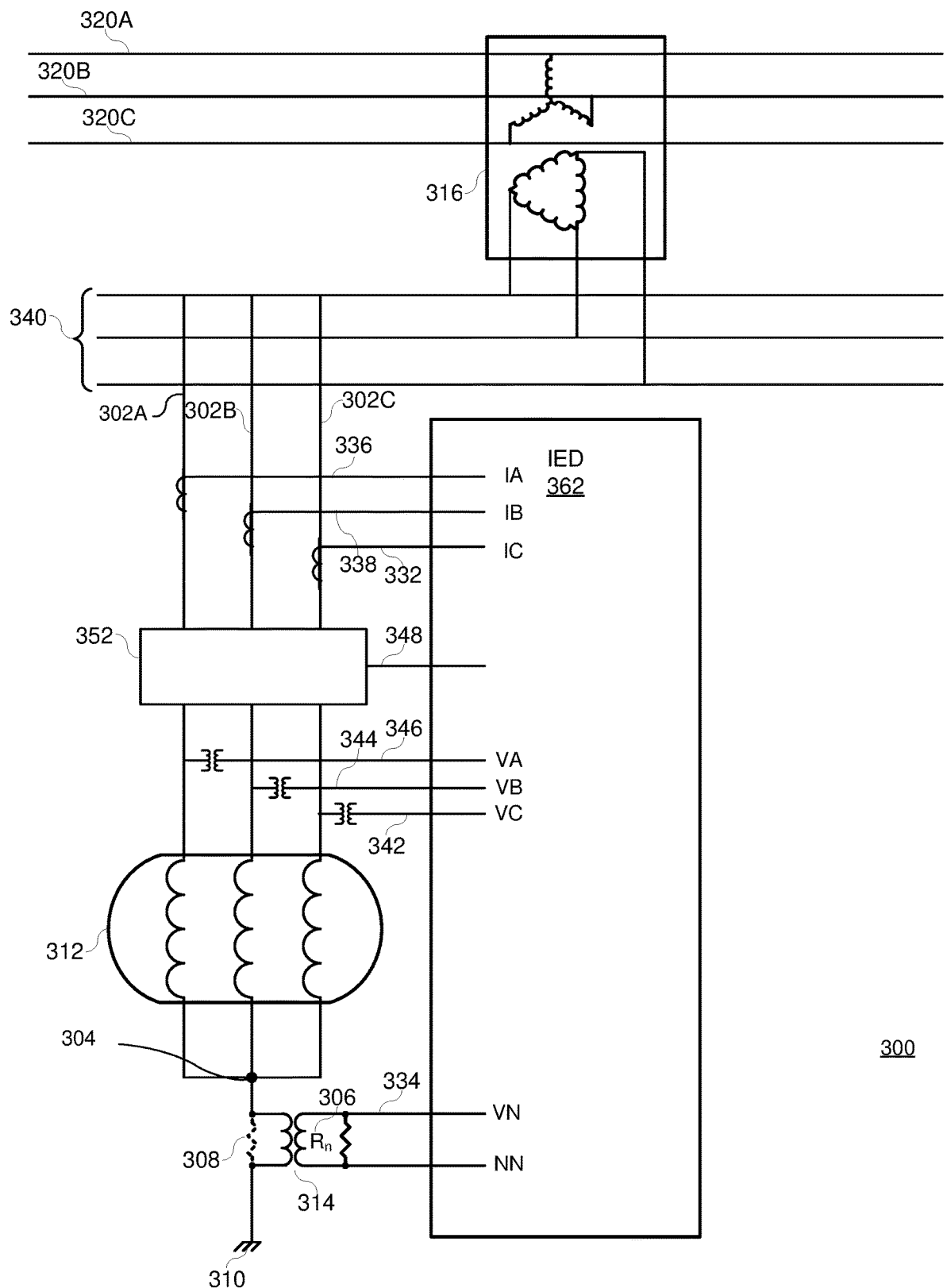
FIGS. 3A and 3B illustrate simplified diagrams of high-impedance grounded generators and devices for providing sensitive directional protection thereto according to several embodiments herein.

FIG. 3A illustrates a simplified diagram of a system 300 in accordance with several embodiments herein showing electrical connections for obtaining electrical measurements for selective directional protection in accordance with several embodiments herein. The system includes a generator 312 in electrical connection with a generation bus 340, which provides electrical power to conductors 320A, 320B, and 320C via transformer 316. Generator 312 may include three phase conductor conductors 302A, 302B, and 302C in connection with the three phases of the generation bus 340 via circuit breaker 352 (which may include a three-phase circuit breaker or three single-phase circuit breakers, or the like). There may be additional generators providing electrical power to generation bus 340 as illustrated in FIG. 2, although only a single generator single generator is illustrated for simplicity. The generator and system may include three phases, A, B, and C. The generator may include a rotor with three phases and a common neutral point 304 connected to ground 310 through a grounding resistor 308 and high-impedance grounding transformer 314.

An IED 362 may be provided to obtain electrical signals from the system 300, determine conditions on the system, and provide protective operations to the system upon detection of certain conditions. For example, the IED 362 may perform selective directional fault detection for generator 312. IED 362 may perform selective directional fault detection for other generators (not illustrated in this FIG. 3) that also provide electrical power to generation bus 340. IED may obtain voltage signals VA 346, VB 344, and VC 342 from the output of generator 312 using potential transformers. Although illustrated as separate (typically connected wye-grounded) PTs, the voltage signals may be obtained using other configurations including, for example, broken-delta connected PTs. IED 362 may obtain current signals IA 336, IB 338, and IC 332 from the stator of generator 312 using current transformers (CTs). IED 362 may further obtain a neutral voltage signal VN 334 from the grounding transformer 314. Furthermore, IED 362 may send command signals 348 to the circuit breaker 352 such as a trip or open command upon determination of an internal fault condition in generator 312. IED 362 may obtain further electrical signals from generator 312, generation bus 340, and other generators in connection with the generation bus 340.

Any terminal CTs that measure zero-sequence current and provide it to the IED may be used for CT signals. In one embodiment, core-balanced CTs may be used. In another embodiment, residually-connected phase CTs may be used.

Figure 3B:
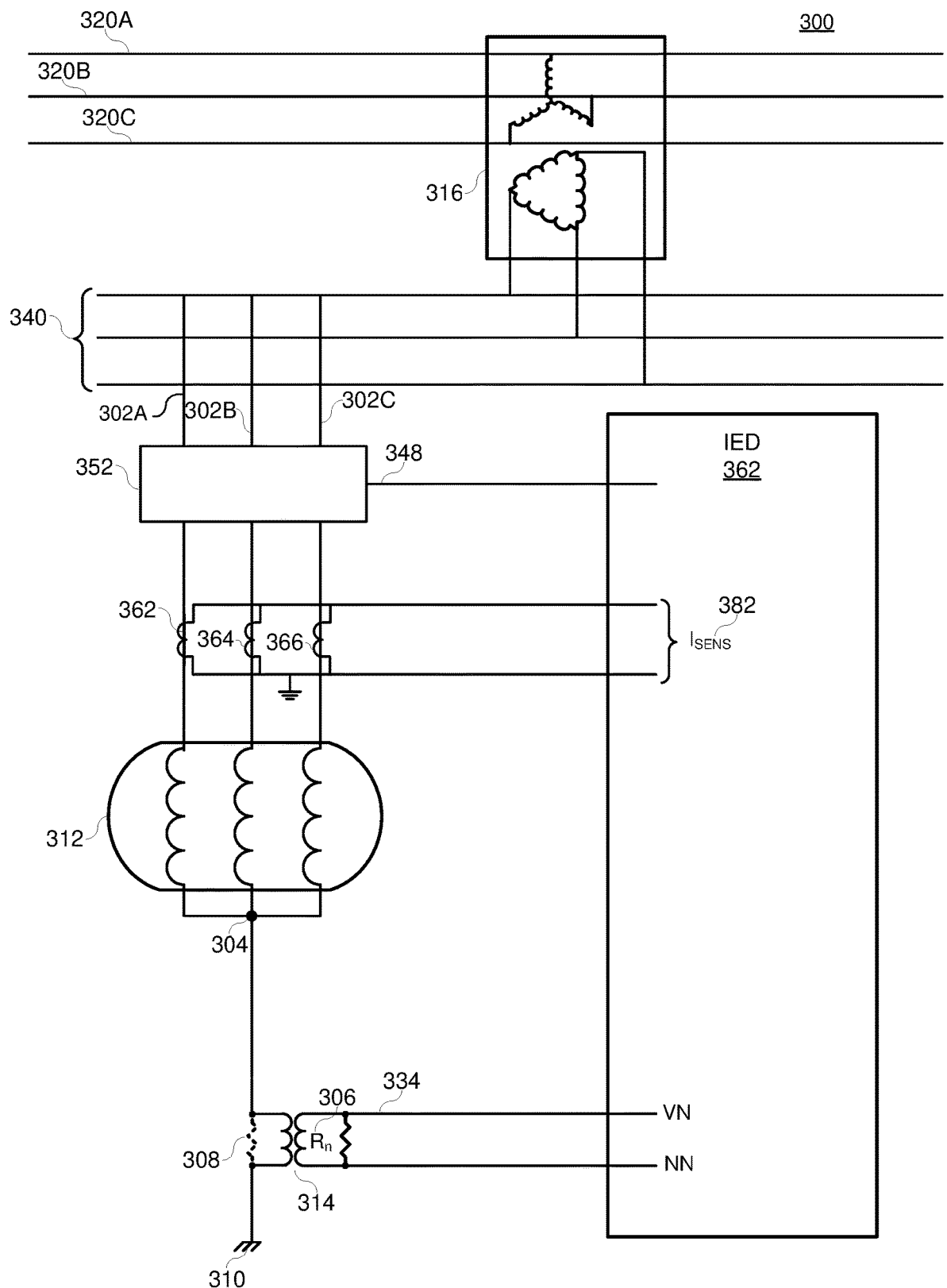

FIG. 3B illustrates a simplified diagram of a system 300 of FIG. 3A, for obtaining sensitive current measurements in accordance with several embodiments herein. Instead of current inputs rated at 5 A or 1 A, the IED inputs for obtaining sensitive current measurements can be rated at around 0.2 A. In various tests it has been observed that such inputs can detect 1 mA of current with an error of 2.5 percent. In certain embodiments herein, the sensitive current measurements may be used to determine a direction of a generator ground fault. It should also be noted that FIGS. 3A and 3B illustrate IEDs 362 capable of obtaining different signals from the electric power delivery system, and are not mutually exclusive. IEDs in accordance with various embodiments herein may obtain any combination of the signals as illustrated in FIG. 3A and FIG. 3B, or even all of the signals as illustrated in FIGS. 3A and 3B, and may even obtain additional signals not illustrated (for example, voltages from the generator bus 340, currents from the generator bus 340, voltages and/or currents from the lines 320A, 320B, 320C, generator temperature, and the like).

IED 362 may obtain sensitive current $I_{SENS}$ 382 signals using CTs 362, 364, 366, and 368 as illustrated. That is, CTs 362, 364, and 366 may be in electrical communication with conductors 302A, 302B and 302C from the generator 312 in star configuration. Accordingly, IED 362 may obtain $I_{SENS}$ 382.

Returning to FIG. 2, there are several configurations or conditions under which a sensitive directional protection element as described herein may be used to determine ground fault conditions in electrical generator(s). A first condition includes operation of both generators 212, 262 in parallel (breakers 226, 276 are closed). A second condition includes operations of a single generator 212, 262 (breaker 226 open and breaker 276 closed; or breaker 226 closed and breaker 276 open). A third condition includes detection of a generator step-up (GSU) transformer ground fault on the high-voltage side that couple through the GSU inter-winding capacitance 292. A fourth condition includes detection of ground faults where both generators 212, 262 are high-impedance grounded via a Peterson coil.

According to several embodiments herein, the direction to a ground fault in a generator system such as those illustrated in FIGS. 2, 3A, and 3B may be determined using incremental residual current. As different systems may have different CTs already installed for obtaining current signals, use of incremental residual current as described herein may improve the functioning of the IED because certain CT configurations result in substantial error in the current signal, which leads to inaccurate directional determination. For example, residually connected phase CTs often have errors that are in the tens of mA, resulting in a steady-state standing error that could be larger than the ground fault current to be detected. As described below, the embodiments herein use the incremental residual current from the sensitive current input to determine a direction to the generator ground fault.

Figure 4:
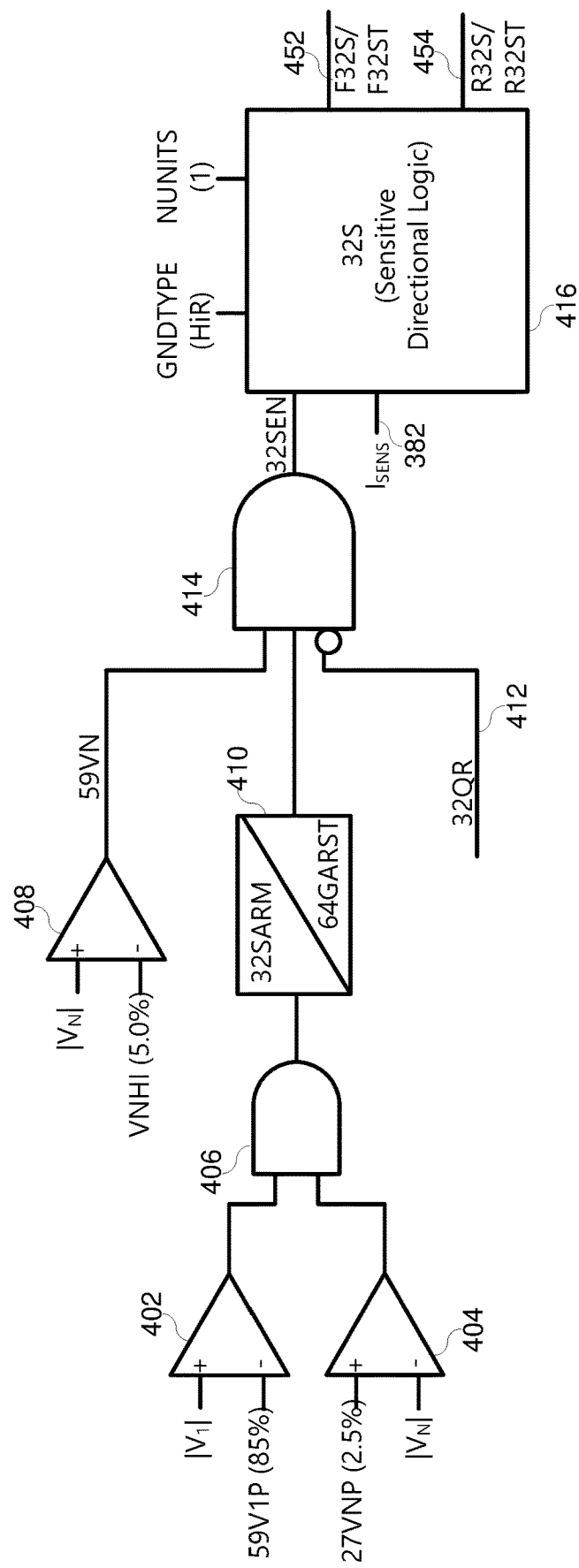
FIG. 4 illustrates a simplified logic diagram for providing sensitive directional protection to a high-impedance grounded generator according to several embodiments herein.

FIG. 4 illustrates a simplified logic diagram for detecting a direction of a ground fault in a high-impedance (or high-resistance) grounded generator in accordance with several embodiments herein. Generally, the embodiments herein first determine that a ground fault is present, and then determine a direction to the fault by comparing a magnitude of an operating quantity created from the incremental residual current and the neutral voltage against forward and reverse thresholds. Security is maintained by determining that sufficient positive-sequence voltage is present while excess neutral voltage is not present prior to the detection of the ground fault.

The sensitive directional logic 416 may declare a forward sensitive directional fault F32S (or latched forward sensitive directional fault F32ST) 452 or a reverse sensitive directional fault R32S (or latched reverse sensitive directional fault R32ST) 454 using $I_{SENS}$ 382 signals, as well as voltage and current signals from the electric generator. In order to arm the sensitive directional logic 416, AND gate 414 must receive: 1) a signal 59VN indicating that the magnitude of the neutral voltage $|V_N|$ is greater than a predetermined threshold such as, for example, 5% of the setting for the high neutral voltage magnitude VNHI; 2) a signal indicating that there is sufficient positive-sequence voltage and negligible neutral voltage prior to the fault; and 3) a negative-sequence directional element 412 has not asserted.

Comparator 408 may compare a magnitude of the neutral voltage $|V_N|$ against the predetermined threshold. If the magnitude of the neutral voltage $|V_N|$ exceeds the predetermined threshold, then the first signal 59VN referenced above is asserted by comparator 408. The magnitude of the neutral voltage $|V_N|$ may be calculated using the signal VN 334 that may be obtained as illustrated and described in FIGS. 3A and 3B. This ensures that a ground event is present before determining a direction to the fault.

The signal indicating that there is sufficient positive-sequence voltage and negligible neutral voltage may be instigated by timer 410. In order to instigate, the time of a sensitive directional arm signal (or time associated with the "quiet time" required by the system) must exceed the time associated with the arm time 32SARM. This instigation is then held for a duration defined by the intermittent ground fault timer 64GARST providing a window that allows the element to be enabled. The timer is started when both: the magnitude of the positive-sequence voltage $|V_1|$ exceeds a minimum threshold such as, for example, 85% of the setting for positive sequence minimum value (59V1P), as shown by the signal from comparator 402; and the magnitude of neutral voltage $|V_N|$ is less than a neutral voltage threshold such as, for example, 2.5% of the setting for low neutral voltage 27VNP, as shown by the signal from comparator 404. This condition must be present for the arm time 32SARM, then the timer 410 asserts the ARMED signal for AND gate 414.

The negative-sequence directional signal 412 is asserted based on the negative-sequence current $I_2$ and the negative-sequence voltage $V_2$ sensed from the generator system. The negative-sequence directional signal 412 may block the sensitive directional fault determination when asserted. The negative-sequence directional element 412 may assert in accordance with various negative-sequence directional elements. For example, the assertion of the negative-sequence directional signal 32QR may require that all three of the following conditions: 1) the generator negative-sequence impedance $Z_{32}$ must exceed a negative-sequence impedance threshold; 2) a magnitude of positive-sequence voltage $|V_1|$ must exceed a voltage threshold; and, 3) a magnitude of the negative-sequence current $|I_2|$ must exceed a threshold.

Returning now to FIG. 4, the sensitive directional logic 416 may be instigated by the sensitive directional signal 32SEN. The sensitive directional logic 416 may use the sensitive current $I_{SENS}$ signal 382 to determine a direction to a fault, and may also use information about the protected system such as, for example, the type of grounding of the generator (GNDTYPE), the number of generators connected to a common generation bus (NUNITS), and the like. Further detail on the sensitive directional logic 416 is illustrated in FIGS. 5A-5D.

Figure 5A:
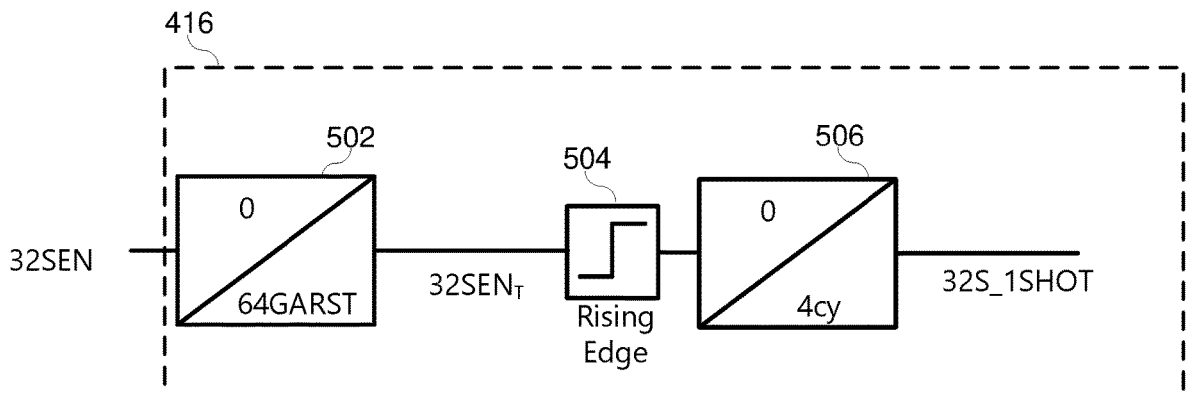
FIGS. 5A, 5B, 5C, and 5D illustrate simplified logic diagrams of sensitive directional protection for a high-impedance grounded generator in accordance with several embodiments herein.

In particular, as illustrated in FIG. 5A, the arming signal 32SEN signals timer 502. In various embodiments, timer 502 may have a dropout time related with the intermittent ground fault detection 64GARST dropout timer to ensure that the logic does not make multiple decision for intermittent faults. A rising edge detector 504 may assert upon detection of a rising edge of the 32SEN signal from timer 502. Timer 506 may be asserted by the rising edge 504, with a drop out of, for example, 4 electrical power system cycles. Timer 506 may assert the 1-shot sensitive directional signal 32S_1SHOT. If the 32SEN signal is deasserted, the outputs from sensitive directional logic 416 (e.g. forward directional F32S, F32ST, reverse directional R32S, R32ST), are also deasserted. That is, assertion of the 32SEN signal may open a window of four power system cycles to determine a direction to the fault as forward (F32ST) or reverse (R32ST).

Once the sensitive directional one-shot signal 32S_1SHOT asserts, the incremental residual current is obtained using a short memory TMEM (e.g. 5 cy), as calculated using Equation 1:

$$DI_{sens}=Isens_k-Isens_{k\text{-}TMEM} \qquad \text{Eq. 1}$$

where:
DIsens is the incremental residual current;
$Isens_k$ is the value of sensitive current Isens 382 at time k; and,
$Isens_{k\text{-}TMEM}$ is the value of sensitive current Isens 382 at time k-TMEM which may be at the time TMEM (e.g. 5 power system cycles) previous to k.

Figure 5B:
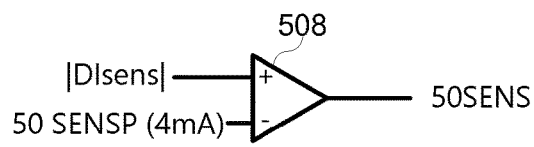

The values of Isens may be stored in a memory such as a TMEM (e.g. 5-cycle) memory. As illustrated in FIG. 5B, the directional logic of FIGS. 5C and 5D may be supervised by an overcurrent element comparing 508 the magnitude of the incremental residual current |DIsens| to an overcurrent threshold such as 50 SENSP, which may be, for example, on the order of 4 mA. The sensitive current high signal 50SENS may be used to enable the sensitive directional fault logic in the reverse direction R32S as illustrated in FIG. 5C, and used the sensitive directional fault in the forward direction F32S as illustrated in FIG. 5D.

Figure 5C:
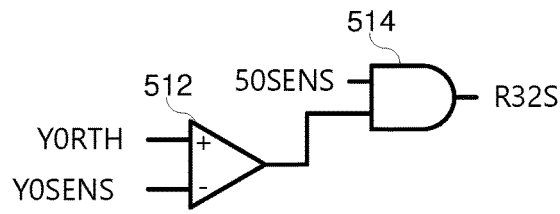
Figure 5D:
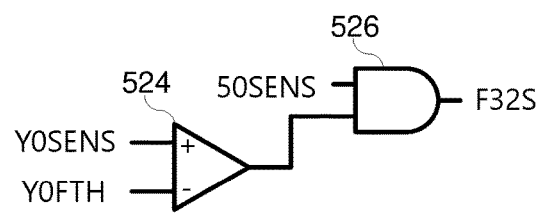

In particular a sensitive directional fault in the reverse direction R32S is determined as illustrated in FIG. 5C, when both: 1) the sensitive current high signal 50SENS is asserted; AND 514, 2) the sensitive admittance Y0SENS is below the reverse threshold Y0RTH in comparator 512. A sensitive directional fault in the forward direction F32S is determined as illustrated in FIG. 5D, when both: 1) the sensitive current high signal 50SENS is asserted; AND 526, 2) the sensitive admittance Y0SENS is exceeds the forward threshold Y0FTH in comparator 524.

The sensitive admittance Y0SENS may be calculated using Equation 2:

$$Y0SENS = \operatorname{Re}\left(\frac{DIsens \cdot e^{-j\frac{5\pi}{4}}}{3*(-V_N)}\right)*\frac{CTR}{PTRN} \qquad \text{Eq. 2}$$

where:
$V_N$ is the neutral voltage;
CTR is the current transformer ratio; and,
PTRN is the potential transformer ratio of the neutral potential transformer.

Furthermore, the thresholds for forward and reverse admittance may be determined as a product of a primary admittance and a factor using, for example, Equations 3 and 4:

$$Y0FTH=+0.1 \text{ mS*primary} \qquad \text{Eq. 3}$$

$$Y0RTH=-0.1 \text{ mS*primary} \qquad \text{Eq. 4}$$

It should be noted that the ±0.1 mS admittance thresholds may be obtained by taking the inverse of a 10 kΩ $Z_0$ impedance threshold (where $Z_0$ is a zero-sequence impedance). Generally, $Z_0$ for high-resistance grounded systems is less than 5 kΩ. Using a 10 kΩ threshold provides adequate margin.

Furthermore, the logic described herein may be used in conjunction with high-resistance (HiR) grounded generators for certain applications. The embodiments herein may be used in a HiR grounded generator to determine a forward fault in a unit-connected case where it is possible that sufficient current is not seen by the sensitive current input. This is dependent on the surge capacitor 282 size. If there are multiple generators connected to the same GSU winding, then there are additional zero-sequence sources via the unfaulted generator stator-ground capacitances and grounding resistances.

The embodiments herein may be used in a HiR grounded generator to determine a reverse fault in the generator zone (iso-phase bus for example), the protected unit will typically source a higher amount of zero-sequence current due to the neutral grounding resistor (NGR) and the stator winding capacitance.

The embodiments herein may determine sensitive directional faults where generators are connected that are high-impedance grounded where a small amount of charging current is available.

The embodiments herein may be applied to resonant-grounded generators (HiL). In certain generator installations, it is possible that sufficient current will not be seen by the sensitive current input. In such installations, no forward or reverse declaration is provided if there is no measurable current. For example, in the case of a reverse fault in the generator zone, the resonant grounded generator will provide negligible current (as is the objective of resonant grounding). Forward faults may still be detected if the surge capacitor sources sufficient zero-sequence current.

Figure 6A:
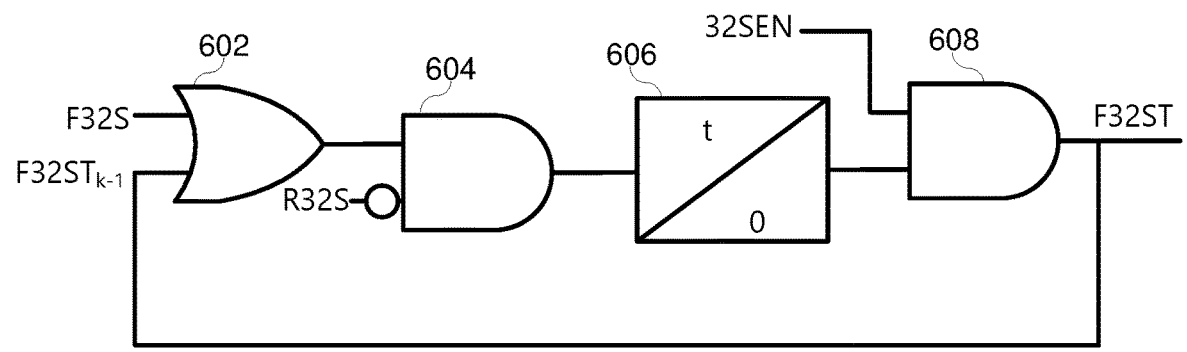
FIGS. 6A, and 6B illustrate simplified logic diagrams of sensitive directional protection for a high-impedance grounded generator in accordance with several embodiments herein.
Figure 6B:
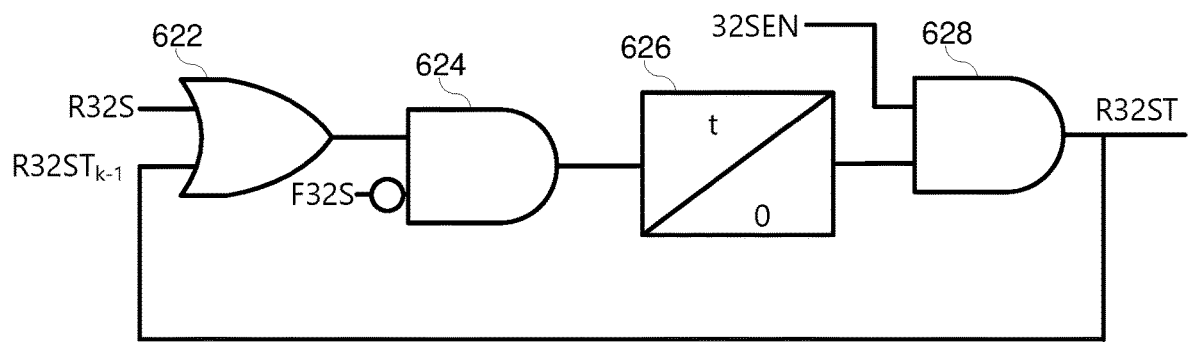

FIGS. 6A and 6B illustrate logic for latching the forward and reverse sensitive directional fault detection signals F32ST, R32ST. In particular, FIG. 6A receives the sensitive forward directional fault detection signal F32S and the previous latched sensitive forward directional fault detection signal F32ST$_{k-1}$ in OR gate 602. Upon assertion of either of these signals, OR gate 602 asserts the AND gate 604. AND gate 604 asserts upon receipt of the signal from OR gate 602 AND the lack of sensitive reverse directional fault detection signal R32S. That is, the forward directional latching determination is supervised by the reverse directional element. If the reverse directional logic asserts the R32S signal, then the forward directional latching logic cannot assert a latched forward directional fault signal F32ST. Upon assertion of the OR gate 602 and absence of the reverse directional signal R32S, then AND gate 604 instigates timer 606. The pickup timer 606 may be set to, for example, 2 cycles, and asserts a signal to AND gate 608. If both the signal from the timer 606 and the 32SEN signal (see FIG. 5A) is present, then AND gate 608 asserts a latched sensitive forward directional fault detection signal F32ST. Thus, the embodiment herein may declare a forward generator ground fault, signifying that the fault is internal to the windings of the generator.

FIG. 6B receives the sensitive reverse directional fault detection signal R32S and the previous latched sensitive reverse directional fault detection signal R32ST$_{k-1}$ in OR gate 622. Upon assertion of either of these signals, OR gate 622 asserts the AND gate 624. AND gate 624 asserts upon receipt of the signal from OR gate 622 AND the lack of sensitive forward directional fault detection signal F32S. That is, the reverse directional latching determination is supervised by the forward directional element. If the forward directional logic asserts the F32S signal, then the reverse directional latching logic cannot assert a latched reverse directional fault signal R32ST. Upon assertion of the OR gate 622 and absence of the forward directional signal F32S, then AND gate 624 instigates timer 626. The pickup timer 606 may be set to, for example, 2 cycles, and asserts a signal to AND gate 628. If both the signal from the timer 626 and the 32SEN signal (see FIG. 5A) is present, then AND gate 628 asserts a latched sensitive reverse directional fault detection signal R32ST. Thus, the embodiment herein may declare a reverse generator ground fault, signifying that the fault is external to the windings of the protected generator.

Several electrical signals are referenced in the embodiments described herein, and may be obtained or calculated from the electric power system equipment. The zero-sequence voltage $V_0$, positive-sequence voltage $V_1$, and negative-sequence voltage $V_2$ may be calculated from the voltage signals VA, VB, and VC 342, 344, 346 from PTs as illustrated in FIG. 3A. The zero-sequence current $I_0$, positive-sequence current $I_1$, and negative-sequence current $I_2$, may be calculated from current signals IA, IB, and IC 336, 338, 340 obtained using CTs as illustrated in FIG. 3A. Voltage and current signals may be obtained from different locations or equipment.

It should also be noted that as used herein, a "forward" fault refers to a fault internal to the generator, and a "reverse" fault refers to a fault external to the generator. Upon detection of a forward fault, the embodiments herein may signal a circuit breaker to open to disconnect the generator from the system (such as, for example, the generation bus). Further, the detection of a forward fault may be used to determine that the subject generator is the faulted generator of multiple generators connected on the same generation bus.

Figure 7:
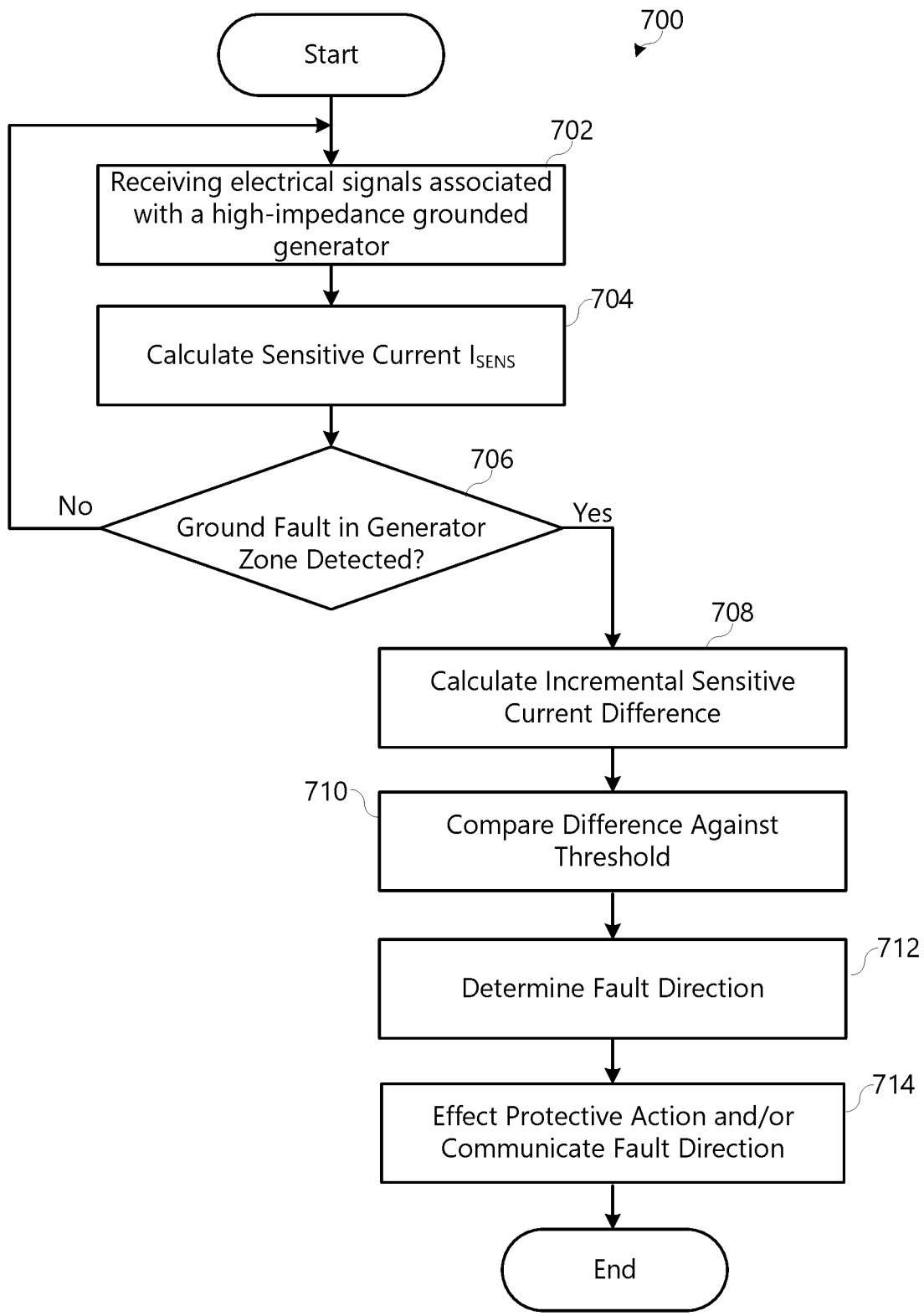
FIG. 7 illustrates a flow diagram of a method for providing sensitive directional protection for a high-impedance grounded generator in accordance with several embodiments herein.

FIG. 7 illustrates a flow diagram of a method for providing sensitive directional protection for a high-impedance grounded generator in accordance with several embodiments herein. The method 700 starts with receiving electrical signals associated with a high-impedance grounded generator 702. The electrical signals may include voltages, currents, sensitive current, and the like as discussed herein. The method 700 may calculate sensitive current $I_{SENS}$ from the signals 704. From the received signals, the method may determine whether a ground fault within the generator zone of protection is detected 706. Detection of an in-zone generator ground fault may be determined when an absolute value of voltage in the neutral $|V_N|$ exceeds a predetermined ratio such as, for example, 5% of the high-neutral voltage setting VNHI (see comparator 408 of FIG. 4) and there is no detection of an out-of-zone condition via 32QR (see 412 of FIG. 4). If such ground fault is not detected, the method returns to receiving signals 702. In terms of FIG. 4, the 59VN signal is not asserted from comparator 408, or 32QR 412 is asserted, so AND gate 414 cannot assert the sensitive ground fault detection 32SEN signal.

If such a ground fault is detected in 706, then the method uses the sensitive current $I_{SENS}$, to calculate incremental residual current 708 such as $DI_{SENS}$ as described herein. For example, the incremental residual current $DI_{SENS}$ may be calculated as a difference between a present sensitive current value $I_{SENS\_k}$ and a past sensitive current value and a past sensitive current value from, for example, 5 power system cycles previous $I_{SENS\_k-5}$. The method may compare the calculated incremental residual current $DI_{SENS}$ against a threshold 710. For example, the method may compare a magnitude of $DI_{SENS}$ against a predetermined or set threshold such as 50SENSP, which may be on the order of 4 mA as shown in FIG. 5B. As described herein, there may be other checks against determining a sensitive forward or reverse fault such as determining whether there is sufficient positive-sequence voltage and not too much neutral voltage, and other checks as described herein.

If the difference exceeds the threshold, then the method may continue to determine the fault direction 712. The direction to the fault may be determined by comparing the sensitive admittance Y0SENS against a forward sensitive admittance threshold Y0FTH and against a reverse sensitive admittance threshold Y0RTH such as is illustrated in FIGS. 5C and 5D. The forward and reverse determination may include a determination of whether the other of the forward and reverse direction determination has asserted. For example, the forward direction determination may be asserted only if the sensitive admittance Y0SENS exceeds the forward sensitive admittance threshold Y0FTH and the reverse direction R32S has not asserted. Furthermore, the determination of forward and reverse may only assert when latched such as, for example, is illustrated and described in coordination with FIGS. 6A and 6B.

When the method determines a direction to the fault 712, the method may effect a protective action and/or communicate the fault direction 714. For a forward fault determination, the method may effect a protective action on the generator such as, for example, operating a circuit breaker to disconnect the generator from the electric power delivery system. As described herein, a forward fault may signify that the fault is internal to the generator (a ground fault on the stator windings). Other protective actions may be taken such as, for example, asserting a communication that the fault is internal. In certain embodiments, further checks may be made before effecting the protective action such as, for example, determining that a reverse fault has not been asserted; determining that a different generator is not also faulted, and the like.

When the method determines a reverse fault 712, the method may assert a communication that a reverse fault has been determined 714. The asserted communication may be a communication to a supervisory system such that a user may know that the fault is external to the generator, and further study of the windings of the generator is not necessary.

Furthermore, the method may determine that the direction to the fault is unknown. That is, the protective device may be configured to allow other protective elements to assert if the direction to the fault using the incremental residual current is not sufficient to determine a fault direction. For example, if both the forward and reverse fault determinations are asserted, then the direction to the fault is unknown, and an action is not taken.

In several embodiments, the method may communicate the fault direction in any case. That is, if any of the forward, reverse, or uncertain fault direction is determined in 712, the direction is communicated 714. The method may then end.

Figure 8:
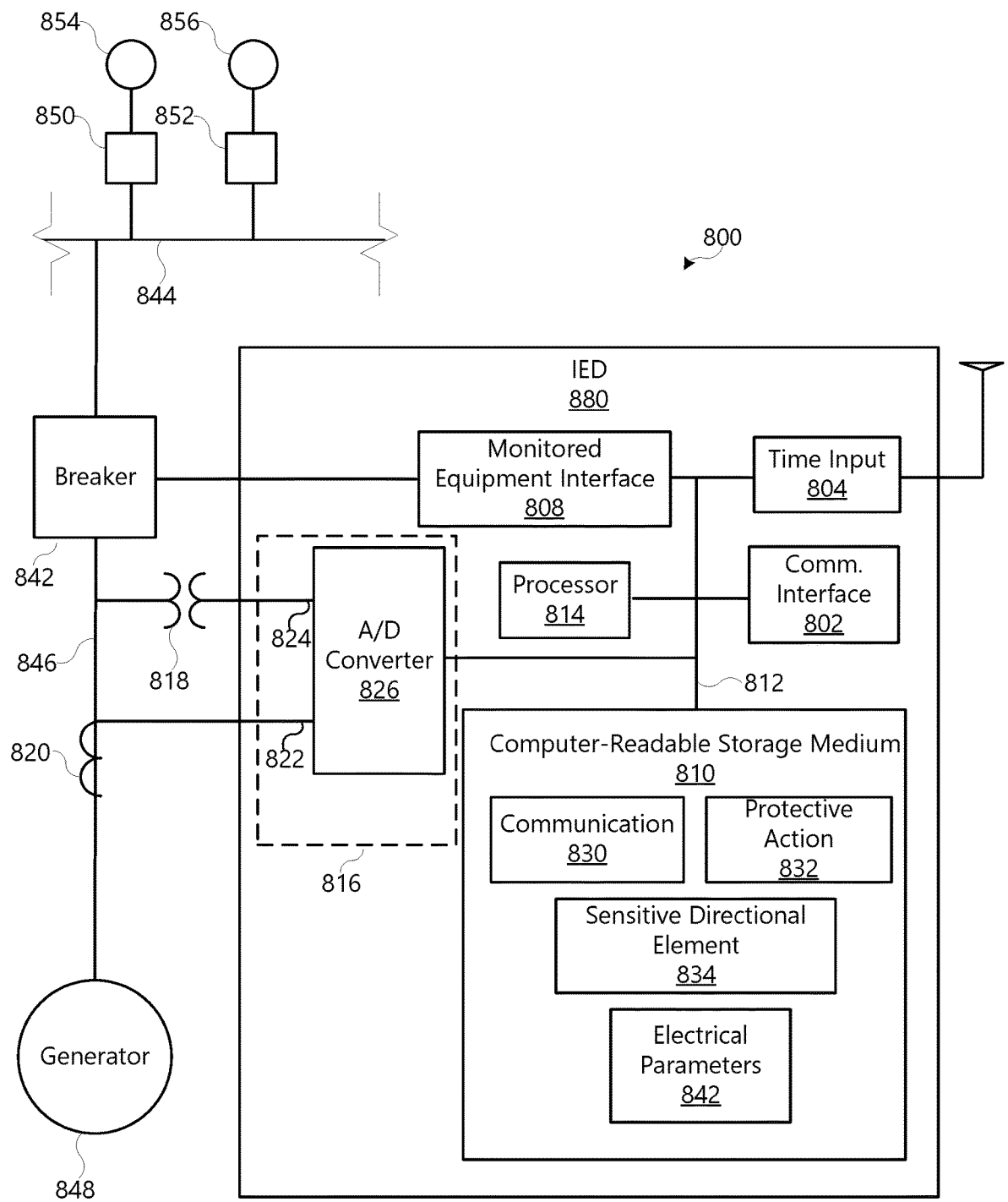
FIG. 8 illustrates a block diagram of a system for providing a protective operation for a high-impedance grounded generator in accordance with several embodiments herein.

FIG. 8 illustrates a block diagram of a system 800 comprising an IED 880 configured to detect sensitive directional fault associated with a high-impedance grounded generator 848 consistent with embodiments of the present disclosure. In various embodiments, IED 880 may comprise a generator relay or other device configured to monitor and/or protect the generator 848. Generator 848 may be selectively connected to a feeder 844 using breaker 842. Feeder 844 may be in electrical communication with an electric power system and generator may provide power to the electric power system via feeder 844.

Additional power system equipment including, for example, equipment 854 and 856 may also be selectively connected to feeder 844 using breakers 850 and 852, respectively. A fault may occur on any part or piece of equipment on the power system. What is needed is an improvement in detecting the location of the fault, especially determining whether the fault is internal to the generator where the generator is high-impedance grounded.

The present disclosure provides a technical solution to the technical problem of detecting a selective directional fault on a high-impedance grounded generator 848 using IED 880, thus improving the operation of the electric power system. In particular, the functioning of IED 880 is improved by the presently-disclosed sensitive directional fault detection using incremental residual current measurements.

To that end, IED 880 may include a communication interface 802 configured to communicate with a communication network. IED 880 may communicate with other IEDs or other devices or systems (e.g., a SCADA system, a wide-area situational awareness system, etc.). The communication interface 802 may be embodied as a network interface, optical interface, a serial interface, or a variety of other types of communication interfaces. IED 880 may also include a time input 804, which may be used to receive a time signal from a Navigation Satellite System (GNSS) or other system, such as the WWVB system. In certain embodiments, a common time reference may be received via network interface 802, and accordingly, a separate time input 804 and/or Global time input 806 may not be necessary. One such embodiment may employ the IEEE 1588 protocol.

A monitored equipment interface 808 may be configured to receive equipment status information from, and issue control instructions to a piece of monitored equipment, such breaker 842. In some embodiments, the equipment status information and/or control instructions may be communicated over the communications interface 802.

A computer-readable storage medium 810 may be the repository of one or more modules and/or executable instructions configured to implement any of the processes described herein. A data bus 812 may link monitored equipment interface 808, time input 804, communication interface 802, and the computer-readable storage medium 810 to a processor 814.

Processor 814 may be configured to process communications received via communications interface 802, time input 804, and/or monitored equipment interface 808. Processor 814 may operate using any number of processing rates and architectures. Processor 814 may be configured to perform various algorithms and calculations described herein using computer executable instructions stored on computer-readable storage medium 810. Processor 814 may be embodied as a general purpose integrated circuit, an application specific integrated circuit, a field-programmable gate array, and/or other programmable logic devices.

In certain embodiments, IED 880 may include a sensor component 816. In the illustrated embodiment, sensor component 816 is configured to gather data from a conductor 846 using a PT 818 and a CT 820. VT 818 may be configured to step-down the voltage (V) on conductor 846 to a magnitude that can be readily monitored and measured by IED 880. As described in more detail above, the power system may be a three-phase power system illustrated in the various figures hereof. Accordingly, the line 846 may be a three-phase line with three conductors, each associated with a different phase. PT 818 may be in delta or wye configuration to obtain voltage measurements from the line 846. Similarly, CT 820 may be configured to proportionally step-down a current flowing through conductor 846 to a magnitude that can be readily monitored and measured by IED 880. Various other instruments may be used to obtain signals from electric power delivery systems including, for example, Rogowski coils, optical transformers, and the like.

An analog-to-digital converter 826 may sample and/or digitize the measured voltage and/or current signals to form corresponding digitized current and voltage signals. A/D converter 826 may be connected to processor 814 by way of a bus 812, through which digitized representations of current and voltage signals may be transmitted to processor 814. As described above, processor 814 may be used to apply equipment status, measurements, and derived values to an IED module. In some embodiments, a separate device may be used in place of a sensor component 816 for providing signals from the conductor 846 to the IED 880. In some embodiments, a separate device may be configured to obtain signals from the electric power delivery system (such as voltage and/or current signals), and create digitized representations of the signals (for example current and voltage signals), apply a time stamp, and/or supply such information to the IED 880. In certain embodiments, the information that has been described as received from sensor component 816 is instead received from communications interface 802.

A monitored equipment interface 808 may be configured to receive status information from, and issue control instructions to a piece of monitored equipment, such as breaker

842. According to some embodiments, control instructions may also be issued via communications interface 802. Control instructions issued via communications interface 802 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface.

Computer-readable storage medium 810 may be the repository of one or more modules and/or executable instructions configured to implement certain functions and/or methods described herein. For example, computer-readable storage medium 810 may include instructions for communications 830, protective action 832, determining a direction to a fault using a sensitive directional element 834, and a repository for electrical parameters 842. The modules and/or executable instructions configured to implement various functions described herein. In one specific embodiment, the modules comprised within computer-readable storage medium 810 may be configured to implement method 700, as illustrated in FIG. 7.

The instructions for communications 830 may include instructions for facilitating communication of information from IED 880 to other controllers and/or other components in the electric power delivery system. The instructions may include the formatting of communications according to a variety of communication protocols, as well as instructions for communicating information about the direction to the fault to other systems.

Electrical parameters 842 may be configured to receive and monitor electrical parameters associated with the electric power system. In the illustrated embodiment, the electrical parameters may be received from sensor component 816. In other embodiments, electrical parameters may be received via communication interface 802. The electrical parameters received by sensor component 816 may be analyzed by electrical parameters module to determine other parameters of interest. For example current measurements may be analyzed to determine a frequency or phase of the electrical energy for purposes of synchronizing rotating machinery 848. Furthermore, nominal values, such as voltage, current, frequency, and the like may be stored in the electrical parameters 842.

The sensitive directional element 834 may include instructions that when executed determine a direction to a fault using incremental residual current according to the various embodiments described herein. For example, the instructions for determining a direction to a fault may compare a difference in incremental residual current quantities against a threshold to determine a sensitive fault; and determining direction based on whether the admittance exceeds a forward or reverse admittance threshold. The sensitive directional element 834 may include instructions that determine other quantities and checks as described in the various embodiments herein.

Instructions for protective action 832 may be configured to implement one or more action in where the fault direction calculated in 834 indicates a forward or reverse direction to the fault. In various embodiments, the protective action 832 may compare determine if a protective action should be taken, and effect the protective action may sending a command to equipment useful for effecting the protective action. For example, the protective action may be disconnection of the generator 848 from the power system. In such embodiment, the instructions for protective action 832 may format and send a command to open circuit breaker 842. Actions implemented by protective action instructions 832 may include one or more of opening a circuit breaker, sending a command to another IED that the IED 880 has detected a reverse direction in its sensitive directional element, warning an operator prior to completing the action, and the like.

The embodiments herein may be applied to systems where multiple generators are in electrical connection with a common bus such as the system illustrated in FIG. 2. In such embodiments, separate protective devices (such as IED 362) may be used to monitor and protect each generator 212, 262. The protective devices may be in communication to share the determination of the direction to the fault using the sensitive current, and use the determinations from both IEDs before taking action. As mentioned above, a forward fault determination may indicate that the fault is internal to the generator windings, whereas a reverse fault determination may indicate that the fault is external to the generator windings. Accordingly, for one IED to positively determine that the fault is internal (forward) to the protected generator, the other IED must also indicate that the fault is external (reverse) to the generator protected by that other IED.

In several embodiments, the multiple-generation fault direction is determined by blocking a forward fault direction in one IED when a forward fault direction is determined by the other IED. Similarly, in certain embodiments the forward fault direction of one generator may be determined only when a reverse fault direction of the other generator is determined.

Figure 9:
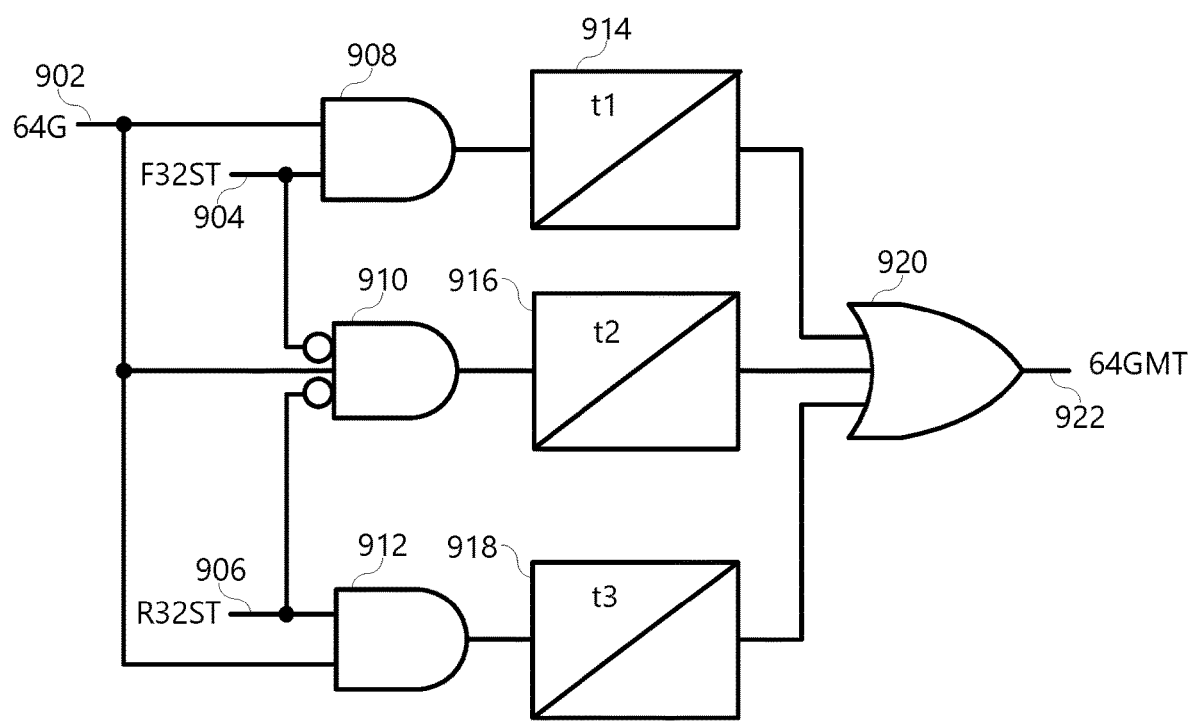
FIG. 9 illustrates a simplified logic diagram of sensitive directional protection for multiple high-impedance grounded generators in accordance with several embodiments herein.

FIG. 9 illustrates a simplified logic diagram of sensitive directional protection for multiple high-impedance grounded generators in accordance with several embodiments herein. The 64G input by itself indicates that there is a ground fault detected but does not provide selectivity. That is, the 64G input does not include information as to which generator is faulted. The 64G input may be asserted by other protection logic or elements such as a ground fault detector. The method illustrated in FIG. 9 provides for selective fault detection and tripping (protective action, or fault clearing) according to several embodiments herein. Forward fault signals and reverse fault signals may be used in combination with a ground fault signal 64G to selectively determine a faulted generator. For example, a latched forward sensitive directional fault signal F32ST 904 and a latched reverse sensitive directional fault signal R32ST 906 may be obtained from the logic of FIGS. 6A and 6B respectively. These signals 904 and 906 are then used with a ground fault signal 64G 902 to assert a selective trip signal 64GMT 922. In particular, AND gate 908 asserts to timer 914 when the ground fault signal 64G 902 is asserted and the forward fault signal F32ST 904 is asserted. AND gate 910 asserts to timer 916 when the ground fault signal 64G 902 is asserted, and neither the forward fault signal F32ST 904 nor the reverse fault signal R32ST 906 are asserted. AND gate 912 asserts to timer 918 when the ground fault signal 64G 902 is asserted and the reverse fault signal R32ST 906 is asserted. If the respective AND gate 908, 910, 912 asserts for the predetermined times of timers 914, 916, 918, then the timers 914, 916, 918 will assert to OR gate 920, which then will assert the output 64GMT 922 allowing for a selective trip. The logic of FIG. 9 describes a tripping sequence that allows the relay to detect and clear a forward fault to trip first via a short timer t1 914, followed by a longer timer t2 916 when the fault direction is unknown, followed by the longest timer t3 918 when the fault direction is determined to be reverse. The outputs from the timers are combined via an OR gate, and the output 64GMT allows the relay to issue a selective trip. Note that the timer values t1, t2 and t3 are configurable by the user. The timer value of t1 provides security and the difference t2–t1 and t3–t2 provides the required coordination achieving selectivity. Timers 914, 916, 918 may be simple pickup/dropout timers or special integrating timers that respond to intermittent faults.

In another embodiment, a communications channel is used to bias the tripping scheme so that the most likely faulted unit is tripped first, followed by less likely ones. For example, of the generators G1 212 and G2 262 of FIG. 2, a bias may be used to trip the generator that is most likely faulted, and then trip the other generator (for example, if tripping the first generator did not clear the fault). Upon determining that a fault is present as described in the various embodiments herein, the IED may issue a trip command to cause a circuit breaker to open to prevent the generator from continued operation during the fault. In situations with more than one generator, according to one technique, the circuit breakers may be tripped in a pre-determined order. For example, a first IED of a first generator may be preset to trip a circuit breaker at a first time, a second IED of a second generator may be preset to trip a circuit breaker at a second time, after the first time, etc. When the fault is isolated from the common bus then the generator causing the fault has been determined. However, such pre-determined orders may be inefficient and/or cause delays in isolating the fault from the common bus. Accordingly, the IED may utilize a technique to determine a likelihood that a fault is located at a particular generator. The IED may send and receive the determined likelihoods to and from the other IEDs. Further, the IED may determine an order in which to trip circuit breakers based on the likelihoods.

Figure 10:
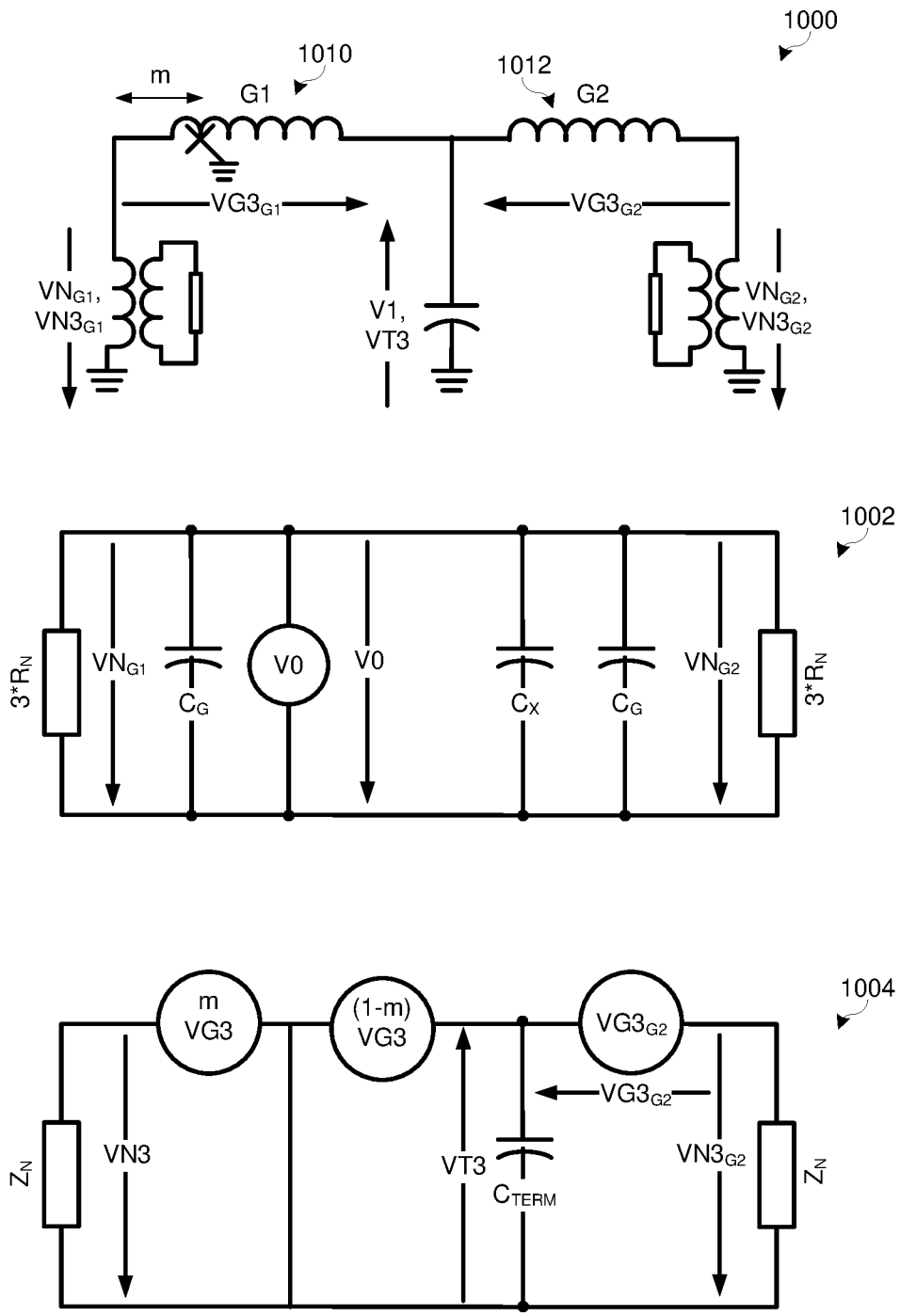
FIG. 10 illustrates a circuit diagram of multiple generators connected to a common bus, in accordance with an embodiment.

FIG. 10 illustrates a single line diagram 1000 of a superimposed circuit along with a corresponding fundamental circuit 1002 and a third harmonic circuit 1004. Upon determining that a ground fault exists, the IED may then determine which circuit breaker to trip. The single line diagram 1000 includes windings 1010 of a first generator G1 and windings 1012 of a second generator G2. The first generator G1 has a neutral voltage VNG1 with third harmonic neutral voltage VN3G1. The second generator G2 has a neutral voltage VNG2 with third harmonic neutral voltage VN3G2. Both generator G1 and G2 may have a common positive-sequence terminal voltage V1 and third harmonic terminal voltage VT3 via the common bus. In the illustrated embodiment, a fault occurs at location m in the windings of the first generator G1.

TABLE 1

| $VG3_{G1}$ = 1.00 $VG3_{G2}$ = 1.25 (mismatch = +0.25) | | | | |
|---|---|---|---|---|
| | G1 | | G2 | |
| m | VN/V1 | VN3/VG3 | VN/V1 | VN3/VG3 |
| 0.0 | 0.0 | 0 | 0 | 0.2 |
| 0.15 | 0.15 | 0.15 | 0.15 | 0.32 |
| 0.5 | 0.5 | 0.5 | 0.5 | 0.6 |
| 1.0 | 1.0 | 1.0 | 1.0 | 1.0 |

In an example shown in Table 1, VG3 for G1 is 1 p.u. and VG3 for G2 is 1.25 and the generators are in phase. The ratios of G1 between VN1/V1 and VN3/VG3 are in agreement on the faulted generator but not on the unfaulted generator, except at the terminal.

TABLE 2

| $VG3_{G1}$ = 1.00 $VG3_{G2}$ = 0.80 (mismatch = −0.20) | | | | |
|---|---|---|---|---|
| | G1 | | G2 | |
| m | VN/V1 | VN3/VG3 | VN/V1 | VN3/VG3 |
| 0.0 | 0.0 | 0 | 0 | −0.25 |
| 0.15 | 0.15 | 0.15 | 0.15 | −0.0625 |
| 0.5 | 0.5 | 0.5 | 0.5 | 0.375 |
| 1.0 | 1.0 | 1.0 | 1.0 | 1.0 |

In another example shown in Table 2, VG3 for G1 is 1 p.u. and VG3 for G2 is 0.80 and the generators are in phase. The ratios of G1 between VN1/V1 and VN3/VG3 are in agreement on the faulted generator but not on the unfaulted generator, except at the terminal.

TABLE 3

| $VG3_{G1}$ = 1.00 $VG3_{G2}$ = 1.00 (no mismatch) | | | | |
|---|---|---|---|---|
| | G1 | | G2 | |
| m | VN/V1 | VN3/VG3 | VN/V1 | VN3/VG3 |
| 0.0 | 0.0 | 0 | 0 | 0.0 |
| 0.15 | 0.15 | 0.15 | 0.15 | 0.15 |
| 0.5 | 0.5 | 0.5 | 0.5 | 0.5 |
| 1.0 | 1.0 | 1.0 | 1.0 | 1.0 |

In a further example shown in Table 3, VG3 for G1 is 1 p.u. and VG3 for G2 is also 1 p.u. and the generators are in phase. That is, there is no difference in third harmonic voltages between the generators G1 and G2. As there is no third harmonic circulation between the generators G1 and G2, the ratios of VN/V1 and VN3/VG3 are in agreement on both machines.

The ratio of neutral third-harmonic normalized with the total generator third harmonic 64G3(|VN3/VG3|) of the faulted unit is the same as the neutral voltage normalized with the positive sequence voltage 59VN1 (|VN/V1|). For the un-faulted units, a different ratio is observed. For example, if we consider Row 2 of Table 1, the difference for the faulted unit is |64G3−59VN1|=|0.15−0.15|=0. For the un-faulted unit, |64G3G2−59VN1|=|−0.06−0.15|=0.21.

From the observations in tables 1-3, the IED monitoring each generator may determine a respective biasing factor (e.g. BIAS=87V31). The biasing factor may be associated with a likelihood that the fault is located within the windings of the generator. For example, if the biasing factors of each generator are compared, the generator with the higher biasing factor may be the more likely generator to have a fault within the windings. The biasing factor may be given by:

$$87V31 = 1 - \min\left(\left|\frac{VN3}{VG3} - \frac{VN}{V1}\right|, 1\right) \quad \text{Eq. 5}$$

In an embodiment that uses the biasing factor of Equation 5, the maximum value of 64G3 is limited to 1. In some embodiments, the first biasing factor may be used directly to determine selection of which circuit breaker to trip. In other embodiments, the first biasing factor may be used to determine a total biasing factor of a generator.

Figure 11:
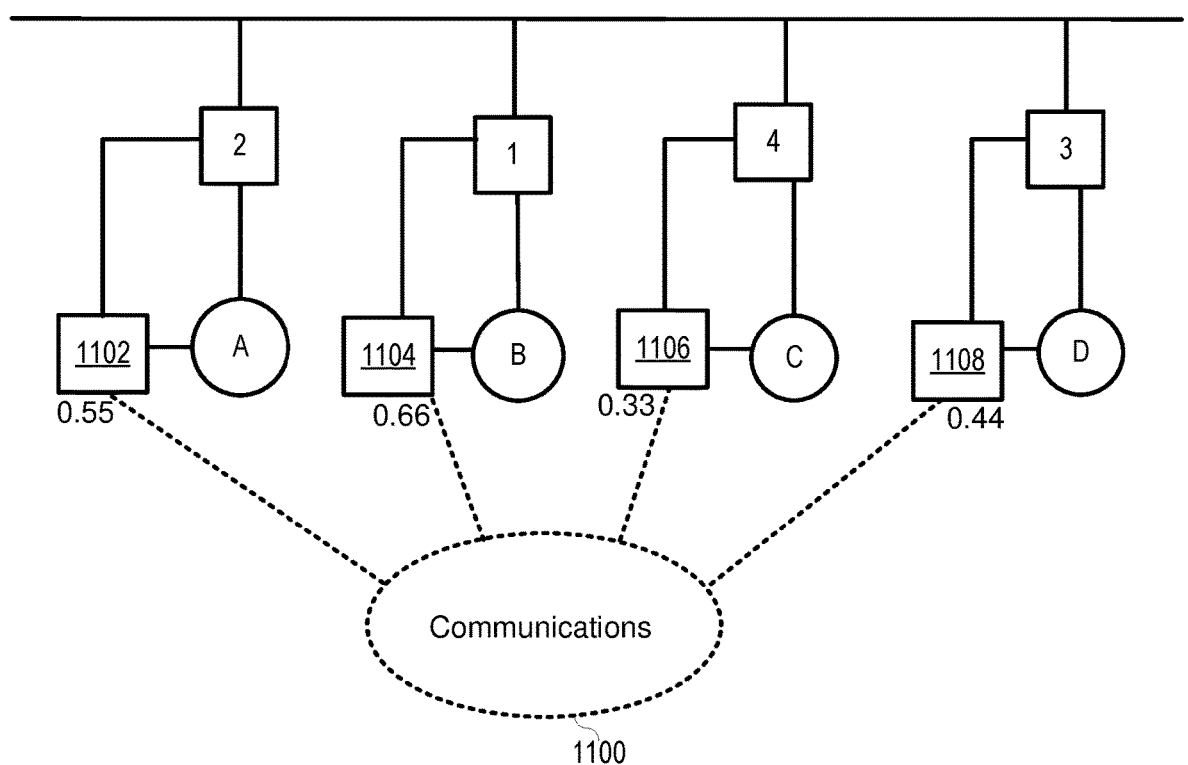
FIG. 11 illustrates a network diagram of intelligent electronic devices (IEDs) monitoring various generators connected to a common bus, in accordance with an embodiment.

FIG. 11 illustrates a communication network 1100 of IEDs that communicate with one another to selectively trip in a sequence based on the likelihoods that the fault is located at various generators. In the illustrated embodiment, the communication network 1100 includes IEDs 1102, 1104, 1106, and 1108 that each monitor generators A, B, C, and D, respectively. Each of the IEDs 1102, 1104, 1106 and 1108 may determine a biasing factor for the respective generators. The biasing factor may be based on 87V31 or a combination of other factors. For e.g. a second biasing factor (32S) may be achieved via some approach that indicates the direction of the internal fault e.g. If the fault belongs to the protected generating unit, the value of 32S could be 1, if it is external to the protected unit the value could be 0. The overall biasing factor may be given by Equation 6:

$$BIAS = \tfrac{2}{3}*32S + *\tfrac{1}{3}*87V31 \qquad \text{Eq. 6}$$

While weights of ⅔ and ⅓ are used in the example, other combinations of the two factors may be used. 32S may be obtained via other methods. In the illustrated embodiment, the IEDs 1102, 1104, 1106, and 1108 may each send the total biasing factor to each of the other IEDs via the communication channel. As mentioned above, the communication channel may be any suitable communication channel.

In the illustrated embodiment, IED 1102 may receive each of the total biasing factors from the other IEDs 1104, 1106, and 1108 associated with each of the other generators. The IED 1102 determines a biasing factor of the generator A to be 0.55. The IED 1102 may then determine an order of commands to trip the circuit breakers of the IEDs. As illustrated, the IED 1102 may receive 0.66, 0.33, and 0.44 biasing factors from the IEDs 1104, 1106, and 1108 respectively. Each of the received biasing factors may be based on a likelihood that a fault is located at the respective generator of the IED.

In the illustrated embodiment, the IED 1102 may determine an order of trip commands to be such that the IED 1104 trips a circuit breaker first, the IED 1102 trips a circuit breaker second, the IED 1108 trips a circuit breaker third, and the IED 1106 trips a circuit breaker fourth due to the biasing factors. In some embodiments, the timing at which each of the circuit breakers tripped may be spaced apart a predetermined amount of time. By tripping the IED 1104 first, the generator most likely to have a fault is isolated from the common bus first. As such, the speed at which the generator most likely to have a fault may be isolated faster on average than a technique that uses predetermined ordering.

The operation of electric power systems is improved using the disclosures herein by better detection of fault direction in high-impedance grounded generators of the electric power system, and effecting protective actions on the electric power system when certain fault conditions are detected. Furthermore, the operation of IEDs is improved using the disclosures herein by detecting direction to the fault where multiple high-impedance grounded generators are connected on a common generation bus.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system for protecting an electric power generation installation in an electric power delivery system, comprising:
    a first protective device in electrical communication with a first generator of the generation installation, comprising:
        a first voltage sensor component in electrical communication with a potential transformer of the electric power delivery system, obtaining a voltage signal corresponding with a voltage of the first generator;
        a first sensitive current sensor component in electrical communication with a current transformer, obtaining a sensitive current signal of the first generator;
        a first processor;
        a first non-transitory computer-readable storage medium in communication with the processor, the first voltage sensor component, and the sensitive current sensor component, comprising instructions that when operated cause the processor to:
            detect a ground fault of the generator installation using voltage signals from the voltage sensor component;
            calculate sensitive current values of the first generator using the sensitive current signal, and store the sensitive current values;
            when the ground fault is detected,
                calculate an incremental residual current of the first generator as a difference between a present sensitive current value and a previous sensitive current values from the stored sensitive current values of the first generator;
                calculate an admittance of the first generator using the incremental residual current of the first generator; and
                determine a direction to the ground fault as forward to the first generator by comparing the admittance of the first generator against a forward admittance threshold; and
            upon determination of a forward fault, effect a protective action of the first generator.

2. The system of claim 1, wherein the instructions of the first non-transitory computer-readable storage medium further cause the processor to:
    determine the direction to the fault as reverse to the first generator by comparing the admittance of the first generator against a reverse admittance threshold.

3. The system of claim 1, wherein the voltage of the first generator comprises a neutral voltage.

4. The system of claim 1, wherein the voltage of the first generator comprises a positive-sequence voltage.

5. The system of claim 1, wherein the instructions of the first non-transitory computer-readable storage medium further cause the processor to detect the ground fault when impedance magnitude of neutral voltage from the first voltage sensor component exceeds a threshold.

6. The system of claim 1, wherein the previous sensitive current value comprises a sensitive current value of the stored sensitive current values five power system cycles previous to the present sensitive current value.

7. The system of claim 1, wherein the instructions of the first non-transitory computer-readable storage medium further cause the processor to determine a direction to the fault as forward to the first generator only when a magnitude of the incremental residual current exceeds a predetermined threshold.

8. The system of claim 1, wherein the instructions of the first non-transitory computer-readable storage medium further cause the processor to determine the direction to the fault as forward to the first generator only when a reverse fault detection to the generator has not been determined.

9. The system of claim 1, wherein a grounding portion of the first generator comprises high-impedance grounding of the first generator.

10. The system of claim 1, further comprising a second protective device in electrical communication with a second generator of the generator installation, the first and second generators in electrical communication with a common generation bus, the second protective device comprising:
- a second voltage sensor component in electrical communication with a potential transformer of the electric power delivery system, obtaining a voltage signal corresponding with a voltage of the second generator;
- a second sensitive current sensor component in electrical communication with a current transformer, obtaining a sensitive current signal of the second generator;
- a second processor;
- a second non-transitory computer-readable storage medium in communication with the processor, the second voltage sensor component, and the sensitive current sensor component, comprising instructions that when operated cause the processor to:
  - detect a ground fault of the generator installation using voltage signals from the second voltage sensor component;
  - calculate sensitive current values of the second generator using the sensitive current signal, and store the sensitive current values;
  - when the ground fault is detected,
    - calculate an incremental residual current of the second generator as a difference between a present sensitive current value and a previous sensitive current values from the stored sensitive current values of the second generator;
    - calculate an admittance of the second generator using the incremental residual current of the second generator; and,
    - determine a direction to the fault as forward to the second generator by comparing the admittance of the second generator against a forward admittance threshold when the direction to the fault of the first generator is not forward; and
  - upon determination of a forward fault, effect a protective action of the second generator.

11. The system of claim 10, wherein the instructions of the second non-transitory computer-readable storage medium further cause the processor to:
- determine the direction to the fault as reverse to the second generator by comparing the admittance of the second generator against a reverse admittance threshold.

12. The system of claim 11, wherein:
- the instructions of the second non-transitory computer-readable storage medium further cause the second processor to communicate to the first protective device, the direction to the fault as reverse to the second generator; and
- the instructions of the first computer-readable storage medium further cause the first processor to determine the direction to the fault as forward after receiving the communication from the second device that the fault is reverse to the second generator.

13. The system of claim 10, wherein the instructions of the second non-transitory computer-readable storage medium further cause the processor to detect the ground fault when an impedance magnitude of neutral voltage from the first voltage sensor component exceeds a threshold.

14. The system of claim 10, wherein the instructions of the second non-transitory computer-readable storage medium further cause the processor to determine a direction to the fault as forward to the second generator only when a magnitude of the incremental residual current exceeds a predetermined threshold.

15. The system of claim 10, wherein the instructions of the second non-transitory computer-readable storage medium further cause the processor to determine the direction to the fault as forward to the second generator only when a forward fault detection to the first generator has not been determined.

16. A method for protecting an electric power generation installation in an electric power delivery system, comprising:
- obtaining from a first voltage sensor component, a first voltage signal proportional to a voltage of a first generator of the electric power generation installation;
- obtaining from a first sensitive current component, a sensitive current signal of the first generator;
- detect a generator ground fault using the first voltage signal
- calculate sensitive current values from the sensitive current signal, and store the sensitive current values;
- calculate an incremental residual current as a difference between a present sensitive current value and a previous sensitive current value from the stored sensitive current values;
- calculate an admittance of the first generator using the incremental residual current;
- determine a direction to the ground fault as forward by comparing the admittance against a forward admittance threshold;
- when a forward fault is determined, effect a protective action.

17. The method of claim 16, further comprising:
- determine a direction to the fault as reverse by comparing the admittance against a reverse admittance threshold; and
- determine the direction to the fault as forward only when the direction to the fault as reverse is not determined.

18. The method of claim 16, further comprising:
- determining a biasing factor associated with a likelihood that a ground fault has occurred at the generator;
- receive at least one other biasing factor associated with a likelihood that the stator ground fault has occurred on at least one other generator on a common bus;
- determine an order in which to trip a circuit breaker of the generator and an at least one other circuit breaker of the at least one other generator based at least in part on the biasing factor and the at least one other biasing factor; and
- send a signal to cause the circuit breaker of the generator to trip based on the order.

19. The method of claim 16, further comprising:
- obtaining from a second voltage sensor component, a second voltage signal proportional to a voltage of a second generator of the electric power generation installation;
- obtaining from a second sensitive current component, a sensitive current signal of the second generator;
- detect a ground fault of the second generator using the second voltage signal
- calculate sensitive current values of the second generator from the sensitive current signal of the second generator and store the sensitive current values;

calculate an incremental residual current of the second generator as a difference between a present sensitive current value of the second generator and a previous sensitive current value of the second generator from the stored sensitive current values;

calculate an admittance of the second generator using the incremental residual current of the second generator;

determine a direction to the fault as forward to the second generator by comparing the admittance of the second generator against a forward admittance threshold;

when a forward fault to the second generator is determined and a forward fault to the first generator is not determined, effect a protective action of the second electric power generator.

20. The method of claim 19, further comprising:

determine the direction to the fault as reverse to the second generator by comparing the admittance of the second generator against a reverse admittance threshold; and determine the direction to the fault as forward to the first generator upon determination of the direction to the fault as reverse to the second generator.

\* \* \* \* \*